United States Patent [19]

Wu

[11] Patent Number: 5,266,507
[45] Date of Patent: Nov. 30, 1993

[54] METHOD OF FABRICATING AN OFFSET DUAL GATE THIN FILM FIELD EFFECT TRANSISTOR

[75] Inventor: Neng-Wei Wu, Hsinchu, Taiwan

[73] Assignee: Industrial Technology Research Institute, Hsinchu, Taiwan

[21] Appl. No.: 884,773

[22] Filed: May 18, 1992

[51] Int. Cl.⁵ ............... H01L 21/336; H01L 21/28; H01L 29/78
[52] U.S. Cl. ..................... 437/41; 437/21; 437/915; 257/66; 257/903
[58] Field of Search ............ 437/41, 21, 915, 44; 257/66, 903

[56] References Cited

U.S. PATENT DOCUMENTS

| | | |
|---|---|---|
| 4,651,408 | 3/1987 | MacElwee et al. ............ 437/915 |
| 4,980,732 | 12/1990 | Okazawa . | |
| 4,987,092 | 1/1991 | Kobayashi et al. ............ 437/915 |
| 5,198,379 | 3/1993 | Adan .............................. 437/21 |

Primary Examiner—Mary Wilczewski
Attorney, Agent, or Firm—George O. Saile

[57] ABSTRACT

A method of fabricating an offset dual gate thin film field offset transistor wherein a lower gate electrode is formed on an insulating substrate is provided. A dielectric layer deposited. A polycrystalline silicon layer deposited and patterned to overlie and extend beyond the edges of the lower gate. A dielectric layer deposited. A metal layer deposited. A photoresist layer deposited and patterned to define a upper gate electrode in the metal layer that overlies the lower gate electrode but extend beyond one edge. The exposed metal layer is removed to form the upper gate electrode. An impurity is ion implanted into the polycrystalline silicon layer to form source and drain regions, using the photoresist layer and metal layer as a mask.

11 Claims, 6 Drawing Sheets

METHOD OF FABRICATING AN OFFSET DUAL GATE THIN FILM FIELD EFFECT TRANSISTOR

BACKGROUND OF THE INVENTION (1) Field of the Invention

This invention relates to improved thin film transistors, more particularly to thin film field effect transistors, provided with dual gate electrodes, one of which has an offset. The invention also relates to methods of fabricating dual gate transistors.

(2) Description of Prior Art

Many different types of semiconductor devices that can store binary information, or data in terms of electric charges, have been developed and are at present used in various computer memories. The list includes, static memories, dynamic memories, read only memories and the like. Semiconductor device memories are widely used because they have the capability of high integration density, and are relatively inexpensive. Among these memories, the static type semiconductor memory has found wide application as a random access memory (RAM), because it can retain stored data without periodic refresh operations.

The static random access memory (SRAM) can be implemented by a large number of flip-flop circuits, each of which stores one bit of information. CMOS flip-flop circuits, each normally composed of a pair of N-channel MOS field effect transistors, and a pair of P-channel MOS field effect transistors, are widely utilized as memory cells because power consumption of the device is very low. However, initially CMOS flip-flop memories necessitated a relatively large area on a semiconductor substrate, making high integration density difficult to attain.

A general circuit structure of the CMOS type static memory cell may be understood by reference to U.S. Pat. No. 4,980,732 and is shown in FIG. 1. In FIG. 1, N-channel MOS transistors QN1, QN2 and P-channel MOS transistors QP1 and QP2 form a CMOS flip-flop circuit in which the transistors QP1 and QN1 having electrically common gates G1 form a first CMOS inverter, and the transistors QP2 and QN2 having electrically common gates G2 form a second CMOS inverter. Output nodes N1 and N2 of the first and second CMOS inverters are connected to a pair of digit lines DL and SL, via a pair of N-channel transfer gate transistors QN3 and QN4, controlled by a word line, WL.

In order to reduce the area that each CMOS circuit occupied on the device, it was proposed to form a pair of P-channel MOS transistors as thin film transistors (TFTS), such as silicon-on-insulator (SOI) structure, with the other pair of N-channel transistors formed in the body of the device. With this structure, the P-channel transistors can overlap a part of the N-channel MOS transistors, and therefore the integration scale of the SRAM is enlarged.

An example of how a thin film transistor is embodied in a CMOS structure is illustrated in FIG. 2. In FIG. 2, a P-type silicon substrate 10 is overlaid with a gate insulator film 16, on which a gate electrode 14 of polycrystalline silicon is formed. In silicon substrate 10 on both sides of the gate electrode 14, N-type diffused regions 14A and 14B at an impurity concentration of between $10^{20}$ and $10^{21}$ Cm$^{-3}$ are formed as source and drain regions of transistor QN1. The gate electrode 14 and the N-type diffused regions 14A, 14B constitute the N-channel transistor QN1 in FIG. 1. Accordingly, the N-type diffused region 14A is connected to the ground potential. In FIG. 2, a gate insulator film 17 is formed on the gate electrode 14, and an N-type silicon thin film 13 is formed on the gate insulator films 16 and 17. P-type diffused region 13S and 13D of an impurity concentration of between $10^{19}$ and $10^{21}$ Cm$^{-3}$ are formed in the ports of the silicon thin film 13 on both the sides of the gate electrode 14, and the P-channel transistor QP1 in FIG. 1 is formed by the SOI structure by the gate electrode 14 and the P-type diffused regions 13S, 13D. The P-type diffused layer 13S is connected to power source potential Vcc by a lead out electrode 11 composed of aluminum. The P-type diffused layer 13D and the N-type diffused region 14B are connected by a conductive layer 18 of aluminum at node N1. Symbols 12A, 12B and 12C denote thick insulator films, and numeral 15 denotes a port of gate electrode G2 of the second inverter which is formed of P-channel transistor QP2 and N-channel transistor QN2 in FIG. 1.

However, the crystalline characteristics of the polycrystalline silicon film, or the monocrystalline silicon film formed on the semiconductor substrate over an insulating layer is not good, and a P-N junction formed in the silicon film is very leaky. Therefore, power consumption, that is standby current of the SRAM employing the aforementioned SOI type transistors, is relatively large.

A solution to reduce the leakage in a polycrystalline silicon layer of a thin film transistor is set forth in U.S. Pat. No. 4,980,732 and is illustrated in FIG. 3. In FIG. 3 the elements corresponding to the elements shown in FIG. 2 are denoted by the same reference numerals. Note that the P-N junction 20 between the channel region 13 and drain region 13D is spaced from the gate electrode 14. In contrast, corresponding P-N junction 19 in FIG. 2 is directly above gate electrode 14. This space between the channel and the drain reduces the Gate-induced Drain Leakage which is caused by the band-to-band tunneling in the gate overlap region of the drain.

As is believed apparent, the locating of the blocking mask for ion implanting the impurities into the polycrystalline film that forms the source and drain regions of the transistor is very exacting. The accuracy of defining the geometry of offset region is limited by the overlay accuracy of photo lithography process which could be large compared with its typical value.

FIG. 4 illustrates a modification of the structure shown in FIG. 3 as given in the U.S. Pat. No. 4,980,732. In FIG. 4 the elements corresponding to the elements shown in FIGS. 2 and 3 are denoted by the same reference numerals. FIG. 4 illustrates a different placement of the thin film P-channel transistor, i.e. over a thick oxide layer 16A. Gate electrode 19 is provided which is electrically connected to gate 14 of the N-channel transistor.

In such very small Thin Film Devices (TFT) with very short channel length, the leakage through the devices in the off state, presents formidable problems. This presents more of a problem, since the medium in the body of the transistor is polycrystalline silicon, as contrasted with monocrystalline silicon. Dual gate electrodes positioned on opposite sides of the polycrystalline layer are known and have materially increased the on current. But the dual gate without offset will still suffer from the large off current, because existence of large gate to drain electric field.

The use of a single gate electrode with an offset region in thin film transistors is also known and has been implemented to reduce the leakage in the off condition. This TFT structure is described in U.S. Pat. No. 4,980,732.

The offset could reduce the electric field between gate and drain and thus reduce the induced leakage current, which is also known as gate induced drain leakage (GIDL).

While the prior art recognizes the need to minimize or eliminate leakage current in thin film transistors, and has separately used the two aforedescribed structures to meet the objective, further reduction is very desirable.

SUMMARY OF THE INVENTION

An object of the invention is to provide an improved thin film transistor that exhibits minimal leakage current.

Another object of the present invention is to provide a method for fabricating an improved thin film transistor, with larger on current.

The mask number of the invention is not increased compared with single gate with an offset.

In accordance with the above objects of the invention, the process of forming an offset dual gate thin transistor is presented. A narrow conductive stripe is formed on an insulating substrate. A layer of dielectric material is deposited over the stripe. A layer of polycrystalline silicon is deposited over the stripe which extends beyond the width of the stripe. A layer of dielectric material is deposited over the polycrystalline silicon. A layer of conductive material is deposited over the dielectric layer. A photoresist layer is deposited and patterned on the dielectric layer such that it overlaps the stripe but extends beyond on edge thereof. The exposed portions of the conductive layer are etched away. A blanket ion implantation with a suitable impurity is performed using the resist as a mask to form source and drain regions in the polycrystalline layer. After the resist is removed, a dielectric layer is formed over the remaining conductive layer.

The offset dual gate thin film transistor has a narrow stripe of conductive material supported on a substrate, which stripe constitutes a lower gate electrode. A dielectric layer overlies the lower gate electrode, a layer of polycrystalline silicon overlies the lower gate electrode, and extends beyond the edges thereof, a dielectric layer overlies the polycrystalline silicon layer, an upper offset gate electrode located above the lower gate electrode with a portion thereof extends beyond one edge of the lower gate electrode, and source and drain regions in the polycrystalline layer are located beyond the opposite edges of the upper offset gate electrode.

BRIEF DESCRIPTION OF THE DRAWINGS

The above and further objects, features, and advantages of the present invention, will become more apparent from the following detailed description taken in conjunction with the drawings, wherein.

DESCRIPTION OF THE PREFERRED EMBODIMENTS

The present invention will be described in detail with reference to the accompanying drawings. It should be noted that the drawings are in greatly simplified form, and illustrate only the transistor structure. In practice the transistor will be only one of many supported on a common substrate, normally a monocrystalline silicon substrate containing other devises, insulation regions, diffused regions, and interconnected with suitable metallurgy into various electronic circuit configurations, most preferable CMOS SRAM circuits. However, the transistor of the invention can be used in any suitable application. The preferred application is in a SRAM.

Figure 1:
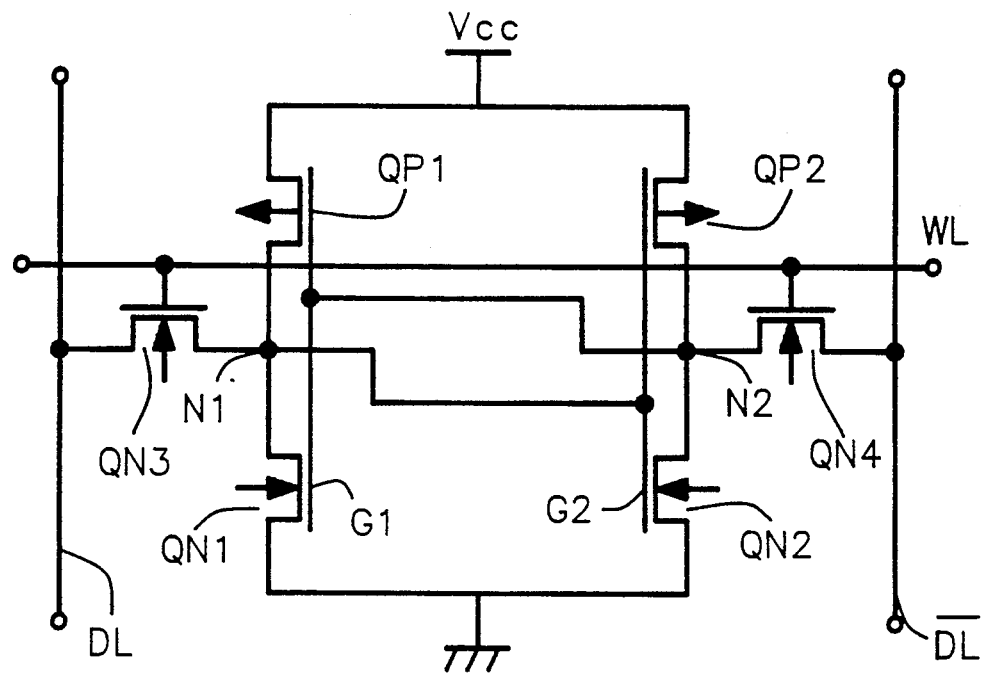
FIG. 1 is a schematic circuit diagram of a CMOS static memory cell known to the prior art.
Figure 2:
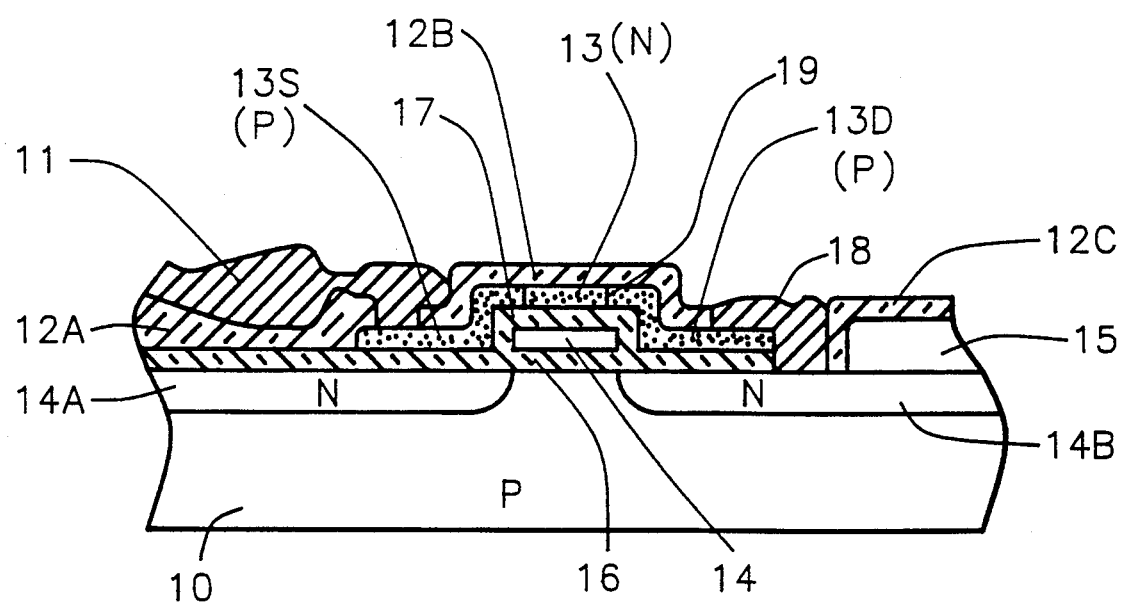
FIGS. 2 and 3 are schematic, cross-sectional views of a portion of a CMOS static memory cell, known to the prior art.
Figure 3:
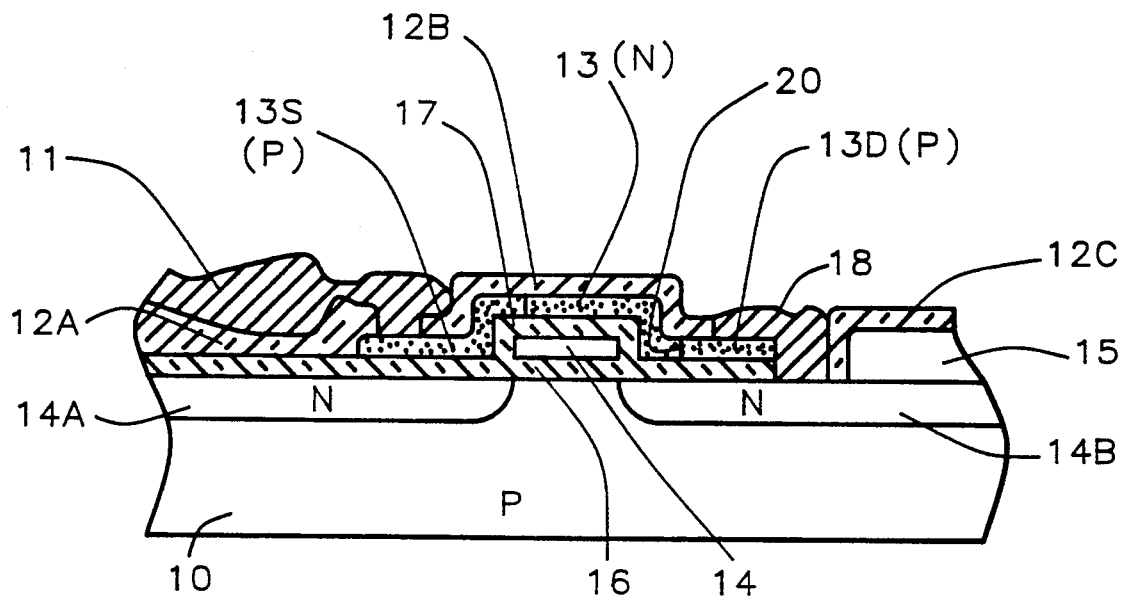
Figure 4:
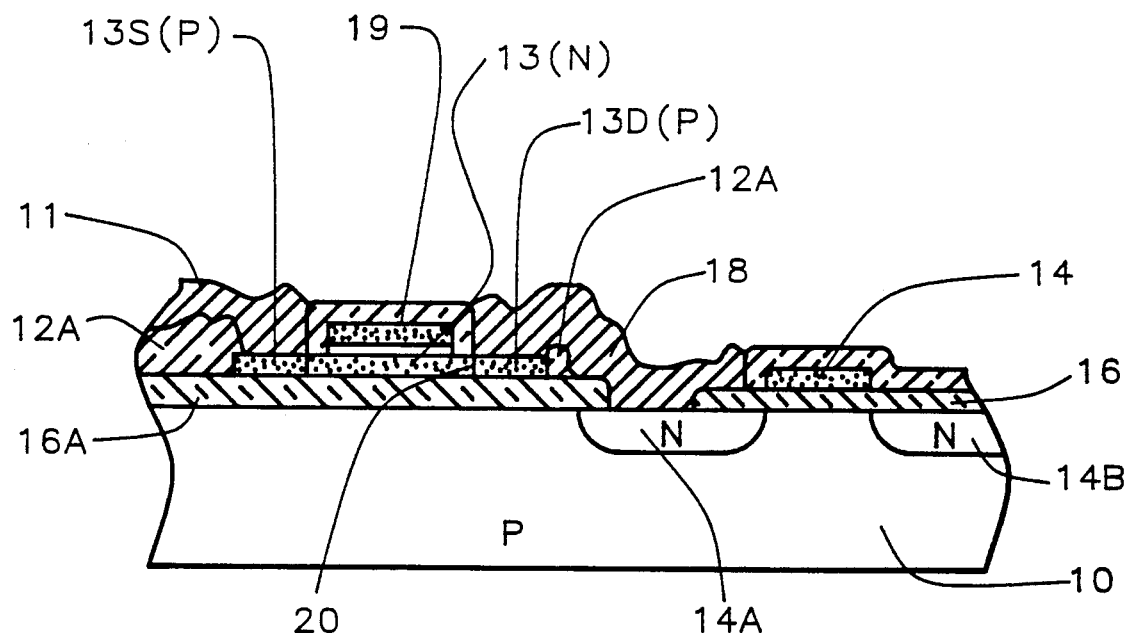
FIG. 4 is a schematic, cross-sectional view of a portion of an improved CMOS static memory cell, known to the prior art.
Figure 5:
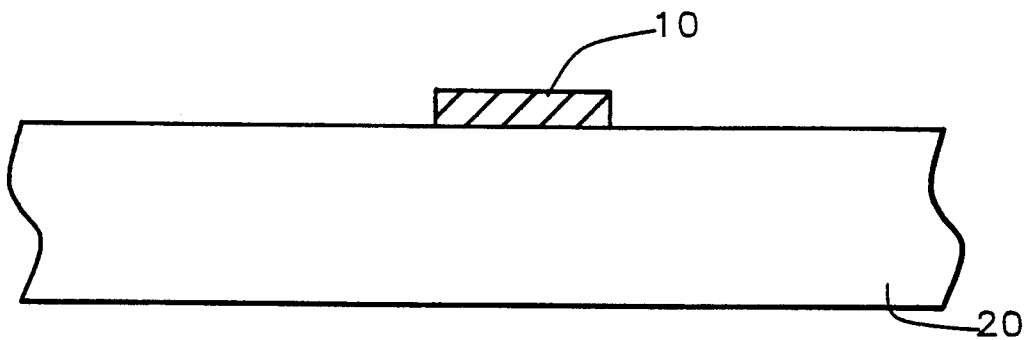
FIGS. 5 through 11 is a sequence of sectional views, in greatly enlarged scale, that illustrate the method of the invention for fabricating an improved thin film transistor.

Referring now to the drawings, and in particular FIG. 5, there is shown a conductive stripe 10 supported on monocrystalline silicon device in substrate 20. The stripe is typically a word line or an extension thereof, of a CMOS memory. The stripe can be of any suitable conductive material, preferably a metal, most preferably a conductive layer such as doped polysilicon or polycide. The width of such a stripe is typically in the range of 0.4 to 1.8 micrometers, and the thickness is in the range of 100 to 2000 Angstrom. When the transistor is used as an element in a semiconductor device, the substrate 20 can be a monocrystalline semiconductor substrate with an overlying insulating layer (not shown) and embodying numerous other active and passive devices. The stripe 10 can be deposited by any suitable method, such as sputter deposition, or chemical vapor techniques that are well known in the art. The stripe 10 can be formed by any suitable etching technique.

Figure 6:
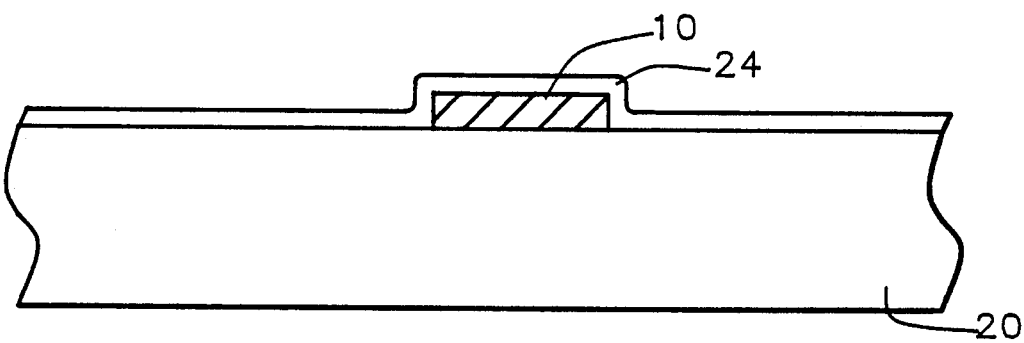

As shown in FIG. 6, a thin dielectric layer 24 is deposited over stripe 10. Stripe 10 will eventually serve as the lower gate electrode, and layer 24 will serve as the gate dielectric. The layer 24 preferably is $SiO_2$ and has a thickness in the range of 100 to 600 Angstrom, and can be deposited by Low Pressure Chemical Vapor Deposition (LPCVD).

Figure 7:
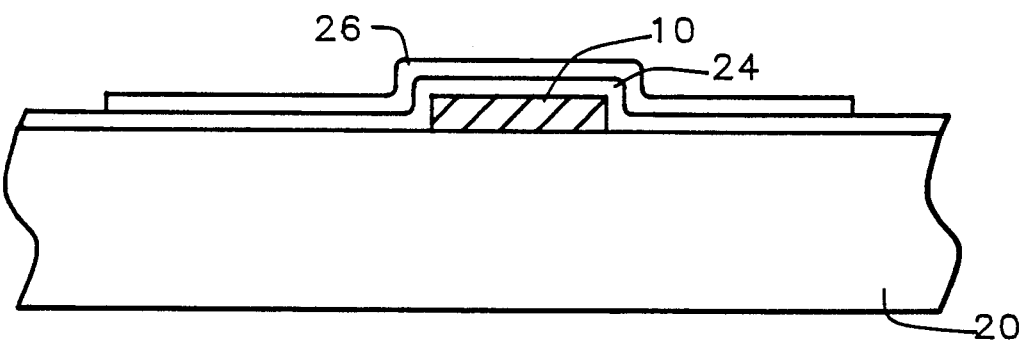

As shown in FIG. 7, a layer 26 of polycrystalline silicon is deposited over layer 24. Layer 26 preferably has a thickness in the range of 50 to 1000 Angstroms, and can be either undoped or doped to increase grain size and/or the threshold. The layer 26 is preferably deposited by LPCVD, either with $Si_2H_6$ or $SiH_4$. Layer 26 is patterned, using standard photolithographic and subtractive etching techniques to overlie stripe 10 and extend beyond its edges.

Figure 8:
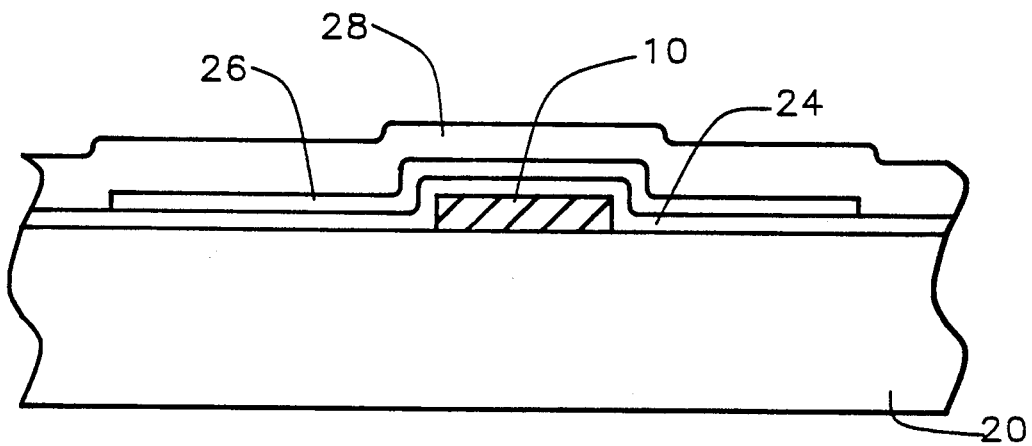

As shown in FIG. 8, dielectric layer 28 is deposited over layer 26. Layer 28 preferably has a thickness in the range of 500 to 2000 Angstroms, deposited by LPCVD and is formed of any suitable material, for example, $SiO_2$. Layer 28 will serve as an upper gate dielectric for the transistor being fabricated.

Figure 9:
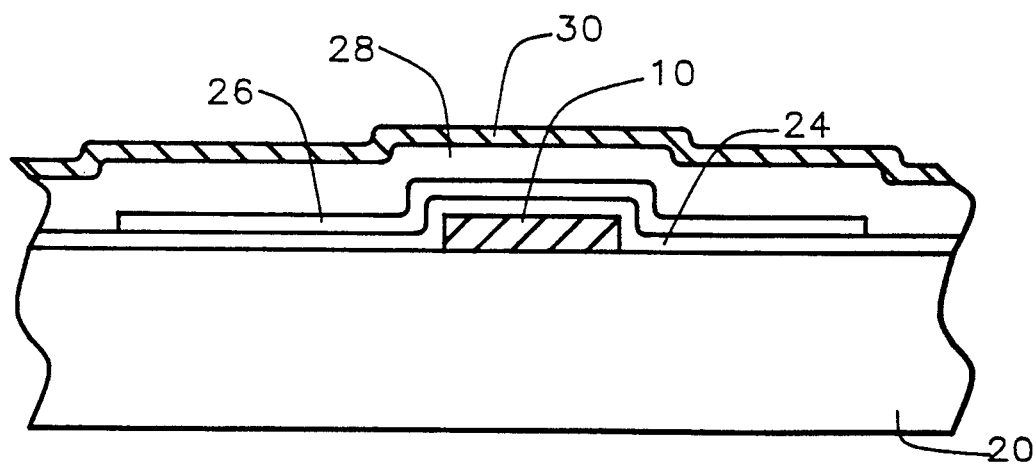

As shown in FIG. 9, a conductive layer 30 is deposited over layer 28. Layer 30 is preferably polysilicon and can be deposited by LPCVD.

Figure 10:
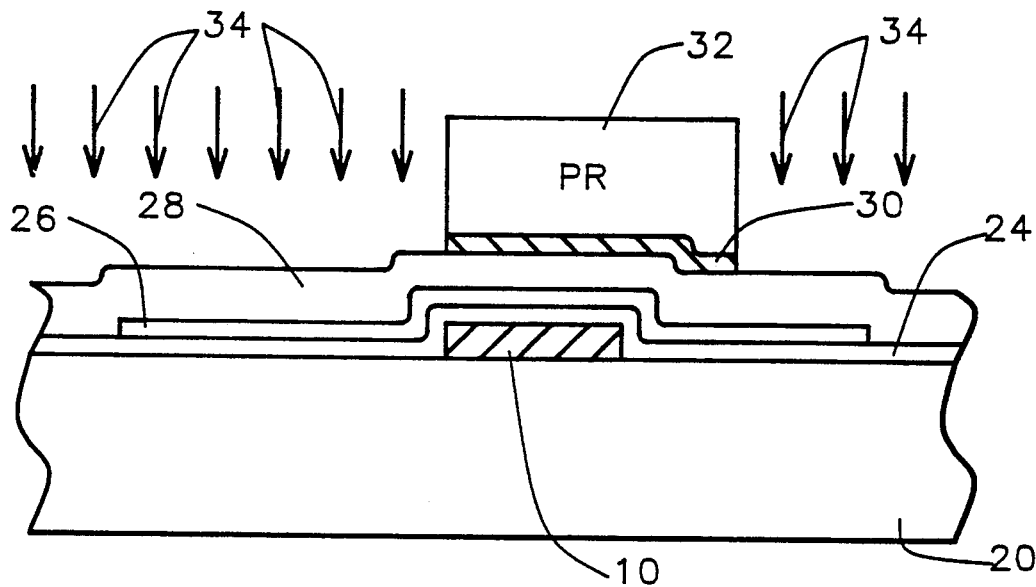

As indicated in FIG. 10, a photoresist layer 32 is deposited over layer 30, and shaped to form the top electrode. The exposed areas of layer 30 are removed by dry etching. Note that the upper gate electrode 30 overlies lower gate electrode 10, with one edge of electrode 30 directly over one edge of the lower electrode 10, and the opposite edge overlapping the edge of lower electrode 10 by a significant amount. This overlap 27 is in the range of 0.2 to 0.6 micrometers.

Figure 11:
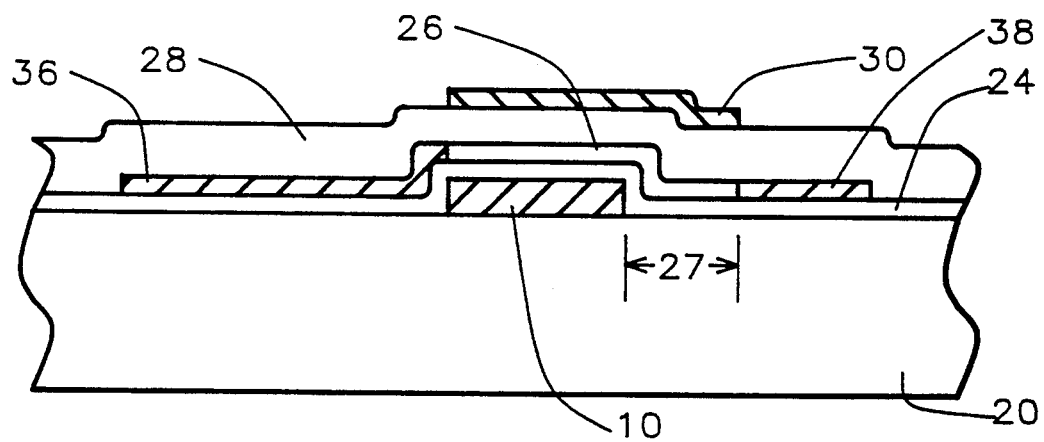

A blanket ion implant, indicated by arrows 34, of a suitable impurity ion, such as $BF_2$ is performed using photoresist layer 32 as a mask. The ions introduced into polycrystalline layer 26 form source and drain regions 36 and 38, as indicated in FIG. 11. After resist layer 32 is removed, a suitable dielectric layer (not shown) is deposited over the surface of gate electrode 30. The device is then completed, i.e. the terminal connections made to the source and drain regions 26 and 28, depending on the application the device is used in.

Compared with a single gate, the dual gate region 29 could induce more carrier concentration and thus increase the on current. Note the offset region 27 with top gate only and thicker gate oxide, the carrier concentration is less than that in dual gate region 29, and thus the electric field is reduced as well as the leakage current. On the other hand the overlap region 17 still has lower sheet resistance than the offset of previous single gate devices which could increase the on current more.

Figure 12:
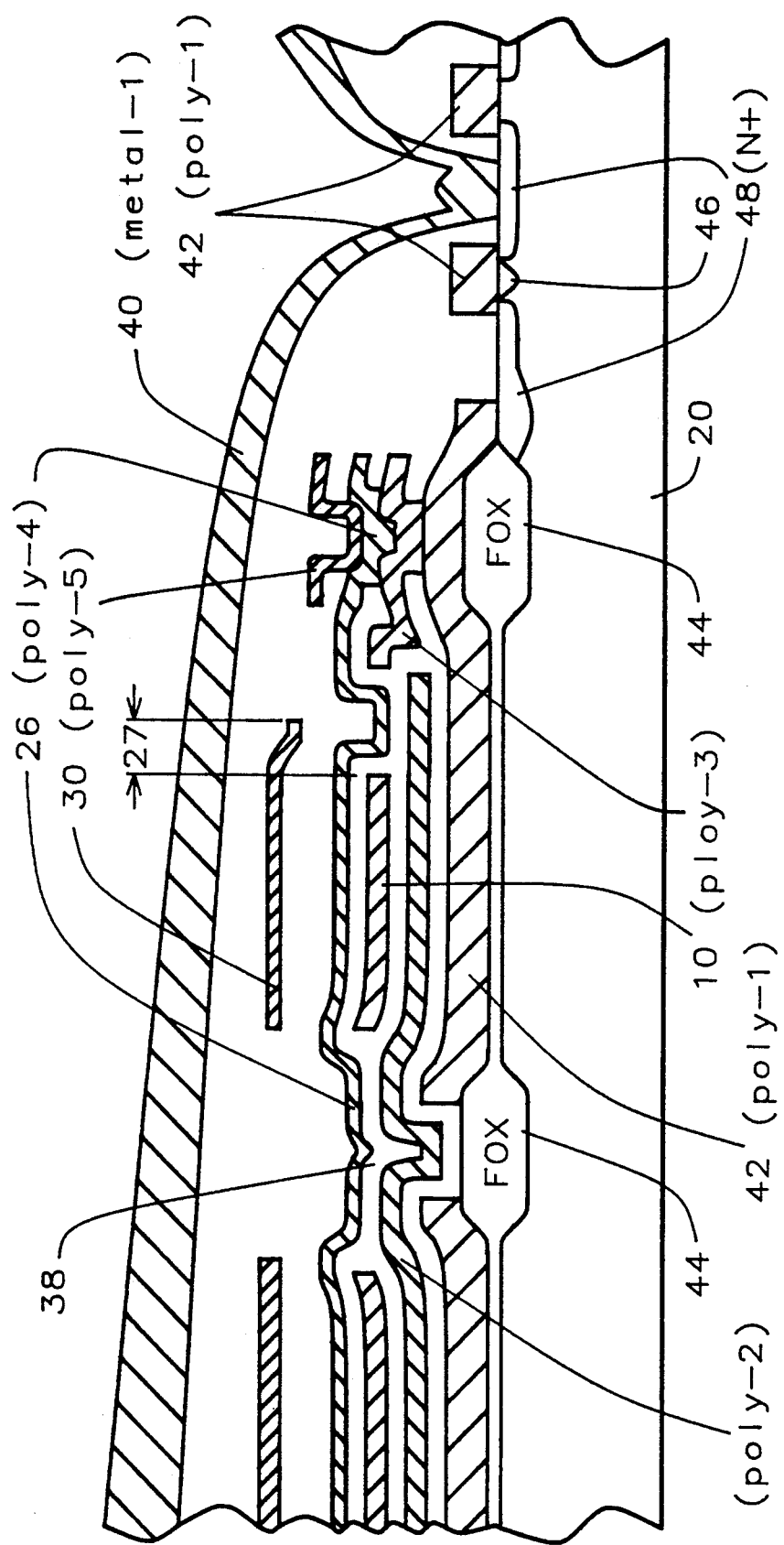
FIG. 12 is a cross sectional view of a portion of a CMOS static memory cell embodying the improved thin film transistor of the invention.

FIG. 12 illustrates the improved thin film transistor of the invention embodied in a convention CMOS device cell. The lower gate is shown as a polysilicon layer 10, that underlies a thin film polycrystalline layer 26 having source and drain regions 36 and 38. The upper gate 30 is shown along with offset 27. The remaining elements mounted on, or in, semiconductor substrate 20, are conventional, including bit line 40, word line 42, field oxide 44, access transistor 46, with the word line 42, as the gate, and regions 48 as source and drain regions.

The aforedescribed dual gate TFT with an offset gate is particularly adapted for use in a CMOS SRAM, since it will materially increase current flow while reducing the off condition current leakage in a TFT, as compared to the known TFT structure i.e. a dual gate and an offset gate structure.

While the invention has been particularly shown and described with reference to the preferred embodiments thereof, it will be understood by those skilled in the art, that various changes in form and details may be made without departing from the spirit and scope of the invention.

What is claimed is:

1. A method of forming an offset dual gate thin film field effect transistor comprising:

providing an insulating substrate;
   depositing a narrow stripe of conductive material on said substrate to serve as a lower gate electrode;
   depositing a thin first layer of dielectric material over said substrate and lower gate electrode;
   depositing and patterning a layer of polycrystalline silicon over said first layer that extend beyond the width of said narrow stripe;
   depositing a second layer of dielectric material over said layer of polycrystalline silicon;
   depositing a layer of conductive material over said second layer;
   depositing and patterning a resist layer over said layer of conductive material such that it overlies said lower gate electrode and extends beyond one edge of said lower gate electrode;
   etching away the exposed portion of the layer of conductive material leaving beneath the resist an offset upper gate electrode which is offset beyond the edge of the lower gate electrode;
   forming a blanket ion implantation with a suitable impurity thereby forming source and drain regions in the exposed layer of polycrystalline silicon layer not underlying the resist;
   removing the resist, and
   forming a third dielectric layer over at least said upper gate electrode.

2. The method of claim 1 wherein said stripe of conductive material is polysilicon having a width in the range of 0.4 to 1.8 micrometers, and a thickness in the range of 100 to 2000 Angstroms.

3. The method of claim 2 wherein the first layer of dielectric material is $SiO_2$, having a thickness in the range of 100 to 600 Angstroms.

4. The method of claim 3 wherein the thickness of said layer of polycrystalline silicon is in the range of 50 to 1000 Angstroms.

5. The method of claim 4 wherein the thickness of said second layer of dielectric material is in the range of 500 to 2000 Angstroms.

6. The method of claim 5 wherein said second layer of dielectric material is $SiO_2$.

7. The method of claim 6 wherein said second layer of dielectric material is deposited by Low Pressure Chemical Vapor Deposition (LPCVD) techniques.

8. The method of claim 1 wherein the offset of said upper gate electrode beyond the edge of said lower gate electrode is in the range of 0.2 to 0.6 micrometers.

9. The method of claim 1 wherein the said offset dual gate thin film FET is embodied as an integral element of a static random access memory device having a plurality of CMOS flip-flop circuits.

10. The method of claim 9 wherein said CMOS circuits each embodies a first thin film FET, and an associated second thin film FET having a channel of a conductivity opposite to the first FET.

11. The method of claim 10 wherein the offset of the upper gate electrode beyond the edge of said lower gate electrode of said first and said second transistors is in the range of 0.2 to 0.6 micrometers.

* * * * *